US008222912B2

(12) United States Patent
Dang et al.

(10) Patent No.: US 8,222,912 B2
(45) Date of Patent: Jul. 17, 2012

(54) PROBE HEAD STRUCTURE FOR PROBE TEST CARDS

(75) Inventors: Son N. Dang, Gilbert, AZ (US); Gerald W. Back, Gilbert, AZ (US); Rehan Kazmi, Gilbert, AZ (US)

(73) Assignee: SV Probe Pte. Ltd., Singapore (SG)

( * ) Notice: Subject to any disclaimer, the term of this patent is extended or adjusted under 35 U.S.C. 154(b) by 535 days.

(21) Appl. No.: 12/403,264

(22) Filed: Mar. 12, 2009

(65) Prior Publication Data

US 2010/0231249 A1    Sep. 16, 2010

(51) Int. Cl.
*G01R 1/067*    (2006.01)
(52) U.S. Cl. ......... 324/755.01; 324/756.04; 324/755.11; 324/756.03; 324/754.01; 324/762.01; 324/762.02; 324/750.15; 324/750.16; 324/754.07
(58) Field of Classification Search ............. 324/756.04, 324/755.11, 756.03, 754.01, 762.01, 762.02, 324/750.15, 750.16, 754.07, 755.01
See application file for complete search history.

(56) References Cited

U.S. PATENT DOCUMENTS

| | | | | |
|---|---|---|---|---|
| 3,534,591 A | * | 10/1970 | Phelan | 73/634 |
| 4,686,467 A | * | 8/1987 | DeLapp et al. | 324/537 |
| 4,774,462 A | * | 9/1988 | Black | 324/756.04 |
| 5,525,911 A | * | 6/1996 | Marumo et al. | 324/754.07 |
| 5,532,613 A | * | 7/1996 | Nagasawa et al. | 324/754.07 |
| 5,892,366 A | * | 4/1999 | Byers | 324/750.25 |
| 5,942,906 A | | 8/1999 | Stowers et al. | |
| 5,952,843 A | * | 9/1999 | Vinh | 324/754.07 |
| 5,974,662 A | | 11/1999 | Eldridge et al. | |
| 5,977,787 A | * | 11/1999 | Das et al. | 324/755.06 |
| 6,024,579 A | * | 2/2000 | Bennett | 439/66 |
| 6,426,637 B1 | * | 7/2002 | Dang et al. | 324/750.25 |

(Continued)

FOREIGN PATENT DOCUMENTS

WO    WO 02/061443 A1    8/2002

(Continued)

OTHER PUBLICATIONS

International Searching Authority, "International Search Report and Written Opinion", PCT/US2010/027098, dated Jul. 6, 2010, 17 pages.

(Continued)

*Primary Examiner* — Huy Q Phan
*Assistant Examiner* — Lamarr Brown
(74) *Attorney, Agent, or Firm* — Hickman Palermo Truong Becker Bingham Wong LLP; Edward A. Becker

(57) ABSTRACT

A probe head assembly for testing a device under test includes a plurality of test probes and a probe head structure. The probe head structure includes a guide plate and a template and supports a plurality of test probes that each includes a tip portion with a tip end for making electrical contact with a device under test, a curved compliant body portion and a tail portion with a tail end for making electrical contact with the space transformer. Embodiments of the invention include offsetting the position of the tail portions of the test probes with respect to the tip portions of the test probes so that the tip portions of the test probes are biased within the apertures of the guide plate, using hard stop features to help maintain the position of the test probes with respect to the guide plate and probe ramp features to improve scrubbing behavior.

21 Claims, 2 Drawing Sheets

U.S. PATENT DOCUMENTS

| | | |
|---|---|---|
| 6,529,021 B1 * | 3/2003 | Yu et al. .................. 324/754.2 |
| 6,841,991 B2 * | 1/2005 | Martin et al. ............ 324/750.24 |
| 7,180,318 B1 * | 2/2007 | Mahoney et al. ........ 324/756.03 |
| 7,808,260 B2 * | 10/2010 | Tran et al. ................ 324/754.01 |
| 2004/0113644 A1 * | 6/2004 | Wood et al. .................. 324/754 |
| 2004/0157350 A1 * | 8/2004 | McQuade et al. ............... 438/14 |
| 2005/0108875 A1 | 5/2005 | Mathieu et al. |
| 2007/0007974 A1 * | 1/2007 | Chiu et al. .................... 324/754 |
| 2007/0075717 A1 | 4/2007 | Kinghorn et al. |
| 2008/0088327 A1 * | 4/2008 | Kister ........................... 324/754 |
| 2008/0088330 A1 * | 4/2008 | Mei ............................... 324/758 |
| 2008/0121879 A1 | 5/2008 | Beaman et al. |
| 2008/0178606 A1 * | 7/2008 | Chen et al. ....................... 62/3.7 |
| 2008/0238408 A1 * | 10/2008 | McQuade .................... 324/149 |
| 2009/0002009 A1 * | 1/2009 | Brandorff .................... 324/758 |
| 2009/0091342 A1 * | 4/2009 | Dyer et al. .................... 324/754 |
| 2009/0144971 A1 * | 6/2009 | Takekoshi ....................... 29/846 |
| 2009/0174423 A1 * | 7/2009 | Klaerner et al. .............. 324/754 |
| 2010/0171519 A1 * | 7/2010 | Lou .............................. 324/754 |
| 2010/0176831 A1 * | 7/2010 | Palcisko et al. .............. 324/757 |

FOREIGN PATENT DOCUMENTS

| | | |
|---|---|---|
| WO | WO 2006/091454 A1 | 8/2006 |
| WO | WO 2006/119405 A1 | 11/2006 |

OTHER PUBLICATIONS

Claims, PCT/US2010/027098, 8 pages.

* cited by examiner

PROBE HEAD STRUCTURE FOR PROBE TEST CARDS

FIELD OF THE INVENTION

This invention relates generally to integrated circuit testing using probe test cards.

BACKGROUND

The approaches described in this section are approaches that could be pursued, but not necessarily approaches that have been previously conceived or pursued. Therefore, unless otherwise indicated, the approaches described in this section may not be prior art to the claims in this application and are not admitted to be prior art by inclusion in this section.

In semiconductor integrated circuit manufacturing, it is conventional to test integrated circuits ("IC's") during manufacturing and prior to shipment to ensure proper operation. Wafer testing is a well-known testing technique commonly used in production testing of wafer-mounted semiconductor IC's, wherein a temporary electrical connection is established between automatic test equipment (ATE) and each IC formed on the wafer to demonstrate proper performance of the IC's. Components that may be used in wafer testing include an ATE test board, which is a multilayer printed circuit board that is connected to the ATE, and that transfers the test signals between the ATE and a probe card assembly. Conventional probe card assemblies include a printed circuit board, a probe head assembly having a plurality of flexible test probes attached thereto, and an interposer that electrically connects the test probes to the printed circuit board. The test probes are conventionally mounted to electrically conductive, typically metallic, bonding pads on a substrate using solder attach, wire bonding or wedge bonding techniques.

In operation, a device under test is moved into position so that the test probes make contact with corresponding contact points on the device under test. When contact is made, the test probes flex, which causes the tips of the test probes to move laterally on and "scrub" the contact points on the device under test. This scrubbing action is desirable because it removes any oxides or other material that may be present on the contact points, providing better electrical contact.

One of the challenges with probe card assemblies is how to reduce the amount of "overdrive" that is required to ensure that all test probes contact a device under test. In the context of probe test cards, the term "overdrive" generally refers to the distance traveled after the first test probe has made contact with a device under test. In most probe card assemblies, since the tips of the test probes are not co-planar, once the first test probe has made contact with the device under test, additional travel is required to ensure that all test probes make contact with the device under test. In applications with poor planarity, the amount of required overdrive can be substantial. For example, in situations where the tip-to-tip planarity is in the range of about 30 to 50 microns, approximately 100 microns of overdrive may be required to ensure that all test probes contact the device under test. Large amounts of overdrive are undesirable because it can shorten the life of test probes, typically measured in the number of "touchdowns", damage test probes, and/or cause shorts between test probes. In view of the foregoing, a probe head assembly that does not suffer from limitations of prior probe head assemblies is highly desirable.

BRIEF DESCRIPTION OF THE DRAWINGS

In the figures of the accompanying drawings like reference numerals refer to similar elements.

DETAILED DESCRIPTION

Figure 1:
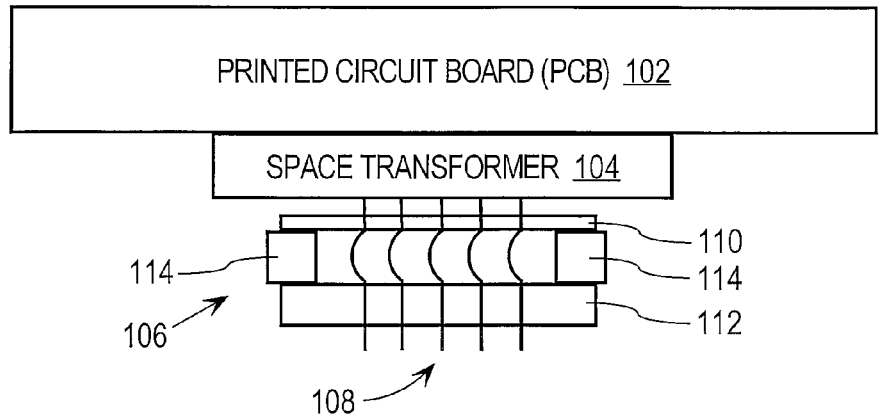
FIG. 1 depicts a probe card assembly for testing a device under test (DUT).

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention. Various aspects of the invention are described hereinafter in the following sections:
 I. Overview
 II. Probe Head Structure
 III. Test Probe Offset
 IV. Hard Stop Features
 V. Probe Ramp Features I. Overview A probe head assembly for testing a device under test includes a plurality of test probes and a probe head structure. One or more test probes from the plurality of test probes includes a tip portion with a tip end for making electrical contact with the device under test, a curved compliant body portion and a tail portion with a tail end for making electrical contact with another element in the probe head assembly, for example a space transformer.

The probe head structure includes a guide plate having a plurality of apertures formed therein and a template having a plurality of apertures formed therein. The tip portions of the one or more test probes are disposed through the plurality of apertures in the guide plate, the tail portions of the one or more test probes are disposed through the plurality of apertures in the template and the curved compliant body portions of the one or more test probes are disposed between the guide plate and the template. The template and guide plate position and align the one or more test probes to match a pattern of desired test points on the device under test.

Embodiments of the invention include configuring the shape of the curved compliant body portions of the one or more test probes so that for each test probe, the tail portion is offset with respect to the tip portion so that the tip portion is biased within one of the apertures of the guide plate. The biasing of the test probes in this manner improves the allowable movement and corresponding scrubbing provided by the tip ends against the device under test. According to one embodiment of the invention, the offset is configured to provide little or no lateral force on the tail portions of the test probes in the template. This helps the tail ends maintain contact with corresponding contacts on the space transformer while reducing the tendency of the tail ends to scrub on the space transformer (or other element). Embodiments of the invention also include using hard stop features to help maintain the position of the test probes with respect to the guide plate and probe ramp features to improve scrubbing behavior. The probe head assembly allows probe head structures with easier assembly, reduced test probe pitch, increased flexibility in test probe design, improved test probe tip-to-tip planarity, improved control over tail ends on the space transformer or other element during contact with a device under test and improved scrubbing behavior at the test probe tips.

II. Probe Head Structure

FIG. 1 depicts an example probe card assembly 100 for testing a device under test (DUT). Probe card assembly 100 includes a printed circuit board (PCB) 102, a space transformer 104 and a probe head structure 106. The PCB 102 provides electrical connections to test equipment and space transformer 104 provide electrical connections between the PCB 102 and the probe head structure 106, which is typically smaller than the space transformer 104. Space transformer 104 may be made as a single layer of material or from multiple layers. For example, space transformer 104 may be a multi-layer ceramic (MLC). As another example, space transformer 104 may be a Multi-Layer Silicon (MLS) space transformer made using silicon wafer fabrication techniques. An MLS space transformer may provide finer contact pitch, compared to an MLC space transformer. PCB 102 and space transformer 104 are not required for the invention, but are depicted in FIG. 1 to show how probe head structure 106 interacts with other example elements.

Probe head structure 106 supports a plurality of test probes 108 that make contact with a device under test. Probe head structure 106 includes a template 110 and a guide plate 112 positioned via spacer elements 114. Test probes 108 extend through apertures in guide plate 112 and through apertures in template 110 and make contact with contact points on space transformer 104. Examples of contact points include, without limitation, pads and stud bumps. Template 110 and guide plate 112 position and align test probes 108 to match a pattern of desired test points on a device under test. The use of a single guide plate 112 with template 110 provides easier assembly than designs that use two guide plates and reduces the likelihood of damaging test probes during assembly. Using a single guide plate 112 with template 110 also allows a greater variety of test probes to be used and provides good planarity between test probes. Spacer elements 114 provide a desired spacing between the template 110 and the guide plate 112 and may also be used to attach the probe head structure 106 to the probe card assembly 100. Template 110 may be attached directly to space transformer 104, e.g., by bonding, or may be spaced apart from space transformer 104 as depicted in FIG. 1, depending upon a particular implementation. Other structures, e.g., a fastener structure, may be used to hold probe head structure 106 in position with respect to space transformer 104 that are not depicted in FIG. 1 for purposes of explanation.

Template 110, guide plate 112 and spacer elements 114 may have a variety of shapes and dimensions, depending upon a particular implementation. For example, template 110, guide plate 112 and spacer elements 114 may be rectangular or circular in shape, or may have irregular shapes. An example range of thickness for template 110 is about 50 microns to about 125 microns. An example range of thickness for guide plate 112 is about 250 microns to about 675 microns. According to one embodiment of the invention, the thickness of template 110 is about 75 microns and the thickness of guide plate 112 is about 500 microns. Guide plate 112 may be implemented by a single layer of material or multiple layers of material, e.g., multiple layers of silicon, and may include multiple layers of the same material or multiple layers of different materials, depending upon a particular implementation.

Template 110, guide plate 112 and spacer elements 114 may be made from a variety of materials. Example materials for guide plate 112 include, without limitation, silicon, silicon nitride, plastic and quartz. An example material for template 110 is a polyimide. Space transformer 104 may be made of silicon to provide accurate positioning of contact pads that contact the tail ends of the test probes. Example processes for making guide plate 112 from silicon include, without limitation, Micro-Electro-Mechanical Systems (MEMS) and Deep Reactive Ion Etching (DRIE) micromachining processes. One benefit provided by the MEMS and DRIE processes is that they allow rectangular apertures or slots to be formed in guide plate 112, which are more compatible with rectangular-shaped test probes, e.g., when the test probes are made using semiconductor fabrication techniques. Rectangular apertures or slots also provide better directional control over the deflection and bending of test probes. For silicon nitride, a laser fabrication process may be used. Other materials may be used, depending upon the requirements of a particular implementation.

According to one embodiment of the invention, template 110 and/or guide plate 112 are made from a rigid material to provide adequate alignment and thermal stability of the test probes, to ensure proper contact with a device under test. One or more portions or the entirety of template 110 and/or guide plate 112 may be coated, for example, with a non-conductive material. Example non-conductive materials include, without limitation, insulating coating materials such as silicon dioxide ($SiO_2$), rubber and other non-conductive materials. The use of non-conductive material in the apertures of guide plate 112 prevents shorts between test probes if the guide plate material is not sufficiently insulating. Example materials for spacer elements 114 include, without limitation, metals, such as steel, or other rigid materials that have good flatness and provide stability for template 110 and guide plate 112.

Test probes 108 may be fabricated using a variety of techniques, depending upon a particular implementation. For example, test probes 108 may be stamped, electro-formed, or fabricated using semiconductor fabrication techniques. Electrolithographically-produced test probes may have fine features that are difficult to create using stamping techniques. Test probes 108 may be any type of test probe, such as cantilever test probes or vertical test probes. Test probes 108 may be made from a wide variety of materials, depending upon a particular implementation, and the invention is not limited to test probes made of particular materials. Example materials include, without limitation, nickel alloys, copper alloys, aluminum, copper or any other metals or alloys. Test probes 108 may also have a wide variety of shapes, depending upon a particular implementation. For example, test probes 108 may be round or rectangular and may be straight, bent or curved. Test probes 108 made from wires are typically round, while test probes 108 made using semiconductor fabrication techniques are typically rectangular. Test probes 108 may be partially or fully coated to change their physical or conductive characteristics. Test probes 108 may also be fabricated with features, e.g., notches, ridges, lips, protrusions, etc., that automatically position the test probes 108 within the template 110 and guide plate 112.

According to one embodiment of the invention, test probes 108 are pre-buckled so that they deflect in generally a specified direction when test probes 108 make contact with a device under test. This reduces the likelihood that test probes 108 will deflect and/or bend in different directions and contact each other causing shorts when moved into contact with a device under test. It also increases the predictability of positioning of test probe tips on a device under test.

III. Test Probe Offset

Figure 2A:
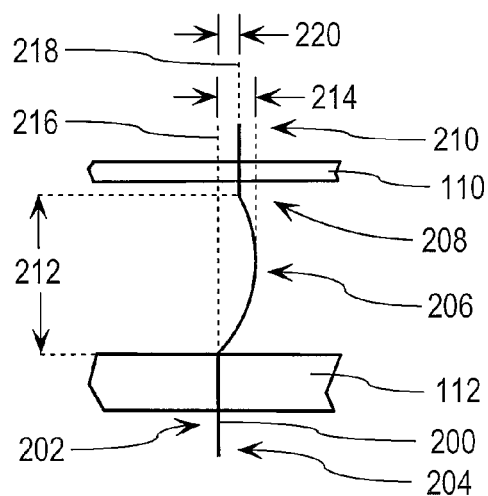
FIG. 2A is a block diagram that depicts an expanded portion of the probe card assembly depicted in FIG. 1.

FIG. 2A is a block diagram that depicts an expanded portion of the probe card assembly 100 depicted in FIG. 1. In FIG. 2A, only portions of template 110 and guide plate 112 and a single test probe 200 are depicted. Test probe 200 includes a tip portion 202 with a tip end 204, a curved compliant body portion 206 and a tail portion 208 with a tail end 210. Tip portion 202 extends through an aperture in guide plate 112. Tail portion 208 extends through an aperture in template 110.

Curved compliant body portion 206 is disposed between template 110 and guide plate 112 and provides a downward spring force on test probe 200. Curved compliant body portion 206 may be the same size as the other portions of test probe 200, or may be a different size, depending upon a particular implementation. For example, curved compliant body portion 206 may have a smaller or larger cross sectional area than the remaining portions of test probe 200 to provide a desired amount of spring force. The cross sectional area of curved compliant body portion 206 may vary along the length of curved compliant body portion 206. Curved compliant body portion 206 may also have different shapes, depending upon a particular implementation. Although depicted in the figures as having a single, continuous curve, curved compliant body portion 206 may have different shapes, such as S-shaped or a compound curve.

Curved compliant body portion 206 may also have a wide variety of dimensions, depending upon a particular implementation. For example, where test probe 200 has a total length of about 2000 microns to about 3000 microns, an example length 212 of curved compliant body portion 206 is about 1000 microns to about 2000 microns. An example width 214, as measured from a longitudinal axis 216 of tip portion 202, is about 200 microns to about 500 microns. According to one embodiment of the invention, curved compliant body portion 206 has a length 212 of about 1500 microns and a width 214 of about 300 microns.

As depicted in FIG. 2A, tail portion 208 is offset from tip portion 202. More specifically, the longitudinal axis 218 of tail portion 208 is offset from the longitudinal axis 216 of tip portion 202 by an offset 220. The amount of offset 220 may vary depending upon a particular implementation. One example range of values for offset 220 is about 50 microns to about 150 microns. According to one embodiment of the invention, the value of offset 220 is about 100 microns.

Figure 2B:
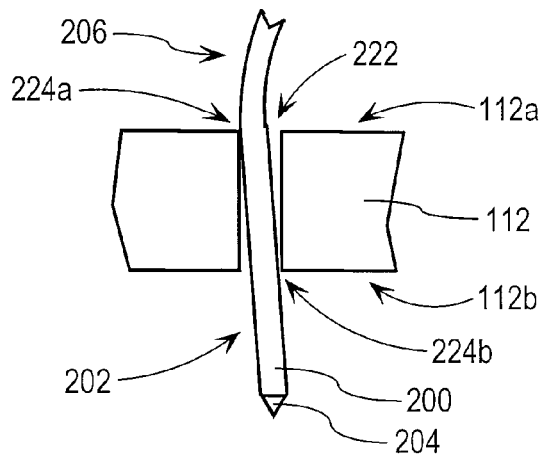
FIG. 2B depicts a close-up view of the test probe depicted in FIG. 2A.

Offsetting tail portion 208 with respect to tip portion 202 biases test probe 200 within an aperture in guide plate 112, which maximizes the allowable movement and provides improved control over the scrubbing provided by tip end 204 against a device under test. FIG. 2B depicts a close-up view of test probe 200 depicted in FIG. 2A. In FIG. 2B, test probe 200 is shown biased against the walls of aperture 222. Specifically, the spring force provided by curved compliant body portion 206 and the offset of the tail portion 208 with respect to the tip portion 202 causes test probe 200 to contact guide plate 112 at a first location 224a adjacent a top surface 112a of guide plate 112. Test probe 200 also contacts guide plate 112 at a second location 224b adjacent a bottom surface 112b of guide plate 112. According to one embodiment of the invention, second location 224b is generally opposite first location 224a.

Offsetting tail portion 208 with respect to tip portion 202 also biases test probe 200 within an aperture of template 110, which reduces movement of the tail portion 208 and allows tail end 210 to maintain contact with a corresponding contact on space transformer 104 when the test probe 200 contacts a device under test. According to one embodiment of the invention, curved compliant body portion 206 is configured so that there is little or no lateral force on tail portion 208. This reduces the likelihood of damage to tail portion 208. In FIG. 2B, tip end 204 is depicted as being pyramidal-shaped for explanation purposes only and tip end 204 may be a wide variety of shapes and sizes, depending upon a particular implementation, and the invention is not limited to test probes having a particular probe tip shape.

IV. Hard Stop Features

As previous described herein, curved compliant body portion 206 applies a spring force to probe 200, causing tip portion 202 to be pushed downward into guide plate 112. According to one embodiment of the invention, one or more hard stop features are provided on test probes to help maintain the position of the test probes with respect to the guide plate. The hard stop features provide improved tip-to-tip planarity by ensuring the tips of the test probes are in close vertical proximity. For example, using the probe head structure described herein, tip-to-tip planarity in the range of a few microns has been achieved. This significantly reduces the amount of overdrive required to ensure that all test probe tips make contact with the device under test.

Figure 2C:
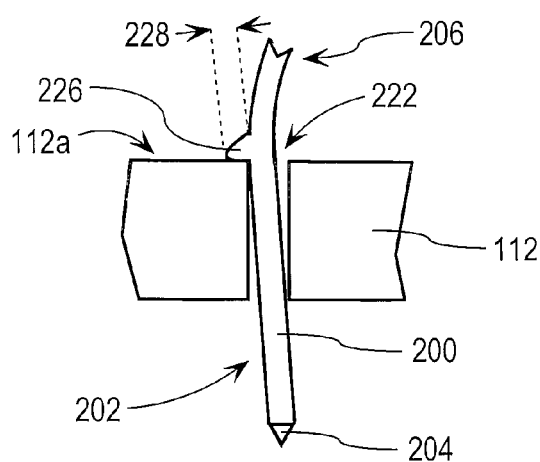
FIG. 2C depicts a test probe that includes a hard stop feature attached to tail portion of a test probe adjacent a guide plate.
Figure 2D:
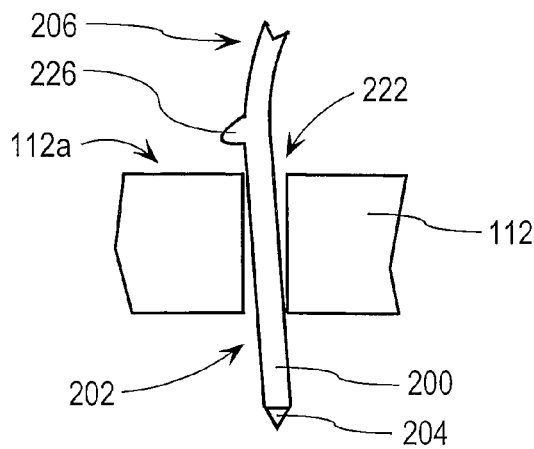
FIG. 2D depicts a test probe in contact with a device under test.

FIG. 2C depicts a test probe 200 that includes a hard stop feature 226 attached to tip portion 202 of test probe 200 adjacent guide plate 112. Curved compliant body portion 206, only a portion of which is depicted in FIG. 2C, exerts a downward force on test probe 200. As depicted in FIG. 2C, hard stop feature 226 limits the amount of downward travel of test probe 200 when hard stop feature makes contact with upper surface 112a of guide plate 112. FIG. 2D depicts test probe 200 when in contact with a device under test. In this figure, the contact with the device under test has moved test probe 200 upward so that hard stop feature 226 is not in contact with upper surface 112a of guide plate 112. This also compresses curved compliant body portion 206. When test probe 200 no longer contacts the device under test, then the spring force provided by curved compliant body portion 206 forces test probe 200 downward until hard stop feature 226 contacts the upper surface 112a of guide plate 112, as depicted in FIG. 2C.

Hard stop feature 226 may be formed as part of test probe 200. For example, hard stop feature 226 may be formed as part of test probe 200 when test probe 200 is created, for example using a wide variety of lithography techniques. Thus, test probe 200 and hard stop feature 226 may be formed together as a single element. Alternatively, hard stop feature 226 may be formed separately and bonded to test probe 200. Hard stop feature 226 may have a wide variety of shapes, for example, round, rectangular, or odd shaped, and is not limited to the example shape depicted in the figures. An example width 228 of hard stop feature 226 is about 5 microns to about 25 microns, but the width 228 may vary considerably depending upon a particular implementation. Since the width 228 of hard stop feature 226 needs to be sufficient to prevent further downward movement of test probe 200, the width may vary, for example, based upon a variety of factors including, without limitation, the cross sectional area of tip portion 202 within guide plate 112 and the cross sectional area of aperture 222.

A single hard stop feature 226 is depicted in the figures for purposes of explanation, but multiple hard stop features may be used. Multiple hard stop features may be disposed on a single side of test probe 200 above the guide plate 112. Alternatively, hard stop features may be disposed on both sides of test probe 200 above guide plate 112. Hard stop feature 226 may be made from a variety of materials and may be the same material as test probe 200, or a different material, depending upon a particular implementation. Example materials include, without limitation, nickel alloys, copper alloys, aluminum, copper or any other metals or alloys. Hard stop feature 226 may also be made from a non-conducting material that does not significantly interfere with the conductivity of test probe 200.

V. Probe Ramp Features

Figure 2E:
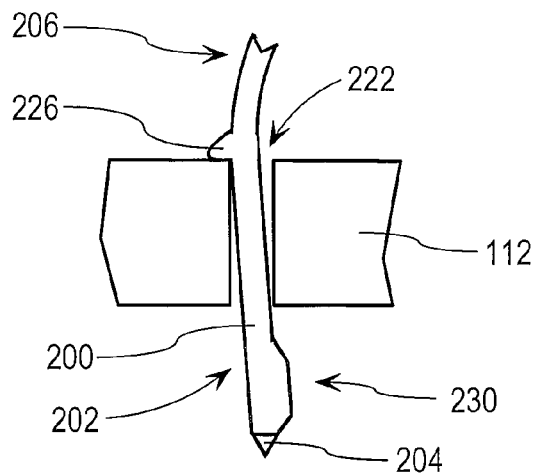
FIG. 2E depicts the use of a probe ramp feature on the tip portion of a test probe that is between a guide plate and a tip end.
Figure 2F:
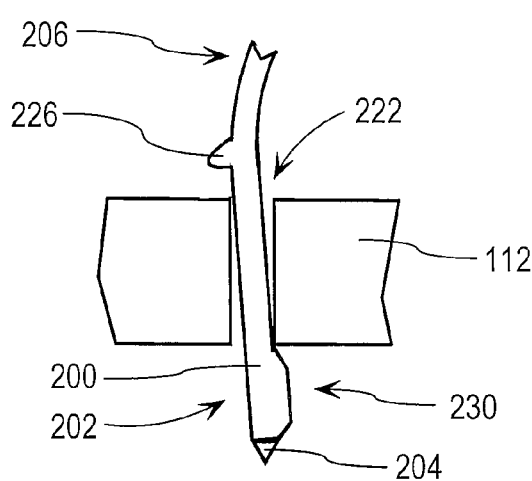
FIG. 2F depicts a test probe after making contact with a device under test.
Figure 2G:
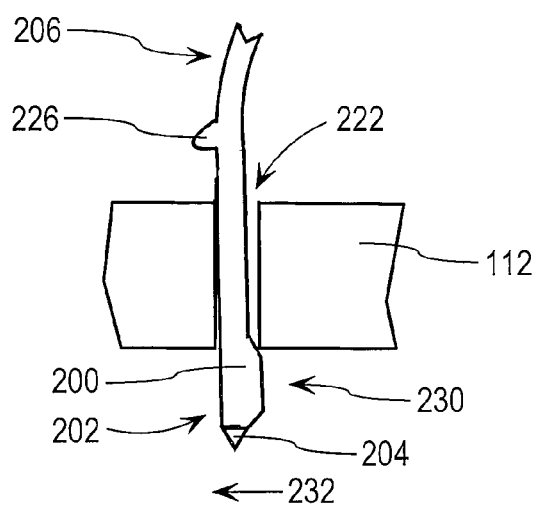
FIG. 2G depicts a test probe making contact with the tapered portion of a ramp feature.

According to one embodiment of the invention, probe ramp features are used to improve scrubbing characteristics. As used herein, a "probe ramp feature" refers to a portion of a test probe where the cross sectional area of the test probe varies along the length of test probe. For example, FIG. 2E depicts the use of a probe ramp feature 230 on the tip portion 202 of test probe 200 that is between guide plate 112 and tip end 204. In this example, the tip portion 202 of test probe 200 below guide plate 112 has a cross sectional area that increases along the length of the tip portion 202 and then decreases adjacent tip end 204. When the test probe 200 makes contact with a device under test, probe ramp feature 230 makes contact with guide plate 112, which provides a controlled scrub. FIG. 2F depicts test probe 200 after making contact with a device under test and, because of the contact, test probe 200 has moved upward in aperture 222, but not yet made contact with probe ramp feature 230. FIG. 2G depicts test probe 200 making contact with the tapered portion of probe ramp feature 230, which causes test probe 200 to move to the left and scrub the device under test, as indicated by reference numeral 232. Depending upon the amount of overdrive, the flat portion of ramp 230 may make contact with guide plate 112.

Compared to test probes without a ramp feature 230, test probes with a probe ramp feature 230 exhibit a more controlled and consistent scrub, with a reduced likelihood of test probe-to-test probe shorting and a reduced likelihood of damage to test probes. The use of a probe ramp feature 230 also provides a more consistent contact resistance (CRes) reading. An example test probe force provided by the use of a probe ramp feature 230 as described herein is from about 0.02 grams/micron to about 0.10 grams per micron. According to one embodiment of the invention, a test probe force of about 0.04 grams/micron to about 0.08 grams per micron is achieved.

Figure 3A:
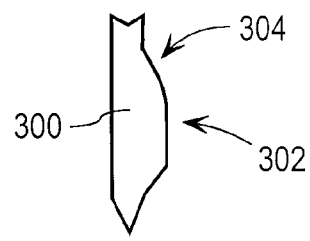
FIG. 3A depicts a tip portion of a test probe that includes a ramp feature.
Figure 3B:
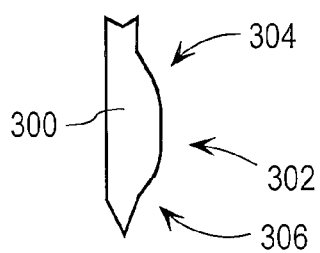
FIG. 3B depicts a ramp feature that includes both rounded top portion and rounded bottom portion.
Figure 3C:
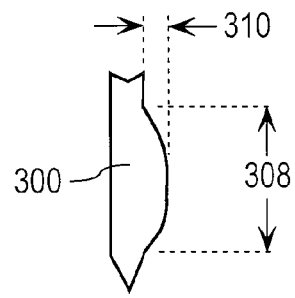
FIG. 3C depicts example dimensions for a ramp feature.

Probe ramp feature 230 may have a variety of shapes and sizes, depending upon a particular implementation, and the shape and size of probe ramp feature 230 is not limited to the examples depicted in the figures and described herein. For example, FIG. 3A depicts a tip portion 300 of a test probe that includes a probe ramp feature 302. In this example, probe ramp feature 302 includes a more rounded top portion 304 than ramp feature 230. As another example, FIG. 3B depicts that ramp feature 302 includes both a more rounded top portion 304 and a more rounded bottom portion 306. FIG. 3C depicts example dimensions for probe ramp feature 302. In this example, probe ramp feature 302 has a length 308 of about 25 microns to about 50 microns and a width 310 of about 2 microns to about 10 microns. According to one embodiment of the invention, probe ramp feature 302 has a length 308 of about 45 microns and a width 310 of about 6 microns. Using a wider probe ramp feature increases the amount of lateral movement at the test probe tip and therefore increases the amount of scrub. Increasing the steepness or slope of a probe ramp feature increases the rate at which the test probe tip moves. For example, for a given speed at which a device under test is moved towards a probe head assembly, or vice versa, a steeper probe ramp feature will cause a test probe tip to scrub faster, while a more gradual probe ramp feature will cause the test probe tip to scrub slower.

The use of test probe tail offsets, hard stop features and probe ramp features may be used alone or in any combination, depending upon a particular implementation, and the invention is not limited to any particular combination of these features. For example, some implementations may include only test probe tail offsets, hard stop features, or probe ramp features. Other implementations may include various combinations of test probe tail offsets, hard stop features and probe ramp features.

In the foregoing specification, embodiments of the invention have been described with reference to numerous specific details that may vary from implementation to implementation. Thus, the sole and exclusive indicator of what is, and is intended by the applicants to be the invention is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A probe head assembly comprising:
   a plurality of test probes, wherein one or more test probes from the plurality of test probes include a tip portion with a tip end for making electrical contact with a device under test, a curved compliant body portion and a tail portion with a tail end for making electrical contact with a space transformer; and
   a probe head structure comprising:
   a guide plate having a plurality of apertures formed therein, wherein the plurality of apertures disposed in the guide plate are coated with a non-conductive material,
   a template having a plurality of apertures formed therein, wherein the tip portions of the one or more test probes are disposed through the plurality of apertures in the guide plate, the tail portions of the one or more test probes are disposed through the plurality of apertures in the template and the curved compliant body portions of the one or more test probes are disposed between the guide plate and the template, and
   wherein the curved compliant body portions of the one or more test probes are shaped so that for each of the one or more test probes, the tail portion is offset from the tip portion.

2. The probe head assembly as recited in claim 1, wherein the tail portion is offset from the tip portion for of each of the one or more test probes in a manner that provides approximately zero lateral force on the tail portions of the one or more test probes.

3. The probe head assembly as recited in claim 1, wherein for each of the one or more test probes, a longitudinal axis of the tail portion is offset from a longitudinal axis of the tip portion.

4. The probe head assembly recited in claim 1, wherein:
the guide plate has a top surface and a bottom surface and the plurality of apertures in the guide plate extend from the top surface to the bottom surface of the guide plate, and
for each of the one or more test probes, the tail portion is offset from the tip portion to cause the tip portion to be biased in an aperture of the guide plate so that so that:
adjacent the top surface of the guide plate, the tip portion makes contact with the guide plate inside the aperture at a first position, and
adjacent the bottom surface of the guide plate, the tip portion makes contact with the guide plate inside the aperture at a second position that is approximately opposite the first position.

5. The probe head assembly recited in claim 1, wherein:
the guide plate has a top surface and a bottom surface and the plurality of apertures in the guide plate extend from the top surface to the bottom surface of the guide plate, and
the tip portions of the one or more test probes each include a hard stop feature disposed in contact with the top surface of the guide plate and limits longitudinal movement of the test probes within the plurality of apertures in the guide plate.

6. The probe head assembly as recited in claim 1, wherein:
the tip portion of each of the one or more test probes includes a first portion disposed within the plurality of apertures in the guide plate and a second portion disposed between the apertures and the tip end, and
the second portion has a cross sectional area that is greater than a cross sectional area of the first portion, so that when the tip end makes contact with the device under test and the second portion makes contact with the guide plate, the tip end scrubs the device under test.

7. The probe head assembly recited in claim 1, wherein one or more of the guide plate or the template comprise silicon.

8. The probe head assembly recited in claim 1, wherein the template comprises a polymeric material.

9. A probe head assembly comprising:
a plurality of test probes, wherein one or more test probes from the plurality of test probes include a tip portion with a tip end for making electrical contact with a device under test, a curved compliant body portion and a tail portion with a tail end for making electrical contact with a space transformer; and
a probe head structure comprising:
a guide plate having a top surface and a bottom surface and a plurality of apertures formed therein and extending from the top surface to the bottom surface,
a template having a plurality of apertures formed therein,
wherein one or more of the guide plate or the template comprise silicon,
wherein the tip portions of the one or more test probes are disposed through the plurality of apertures in the guide plate, the tail portions of the one or more test probes are disposed through the plurality of apertures in the template and the curved compliant body portions of the one or more test probes are disposed between the guide plate and the template, and
wherein the tip portions of the one or more test probes each include a hard stop feature that is disposed in contact with the top surface of the guide plate and limits longitudinal movement of the test probes within the plurality of apertures in the guide plate.

10. The probe head assembly as recited in claim 9, wherein a longitudinal axis of the tail portion of each of the one or more test probes is offset from a longitudinal axis of the tip portion of each of the one or more test probes.

11. The probe head assembly recited in claim 9, wherein:
the guide plate has a top surface and a bottom surface and the plurality of apertures in the guide plate extend from the top surface to the bottom surface of the guide plate, and for each of the one or more test probes, the tail portion is offset from the tip portion to cause the tip portion to be biased in an aperture of the guide plate so that so that:
adjacent the top surface of the guide plate, the tip portion makes contact with the guide plate inside the aperture at a first position, and
adjacent the bottom surface of the guide plate, the tip portion makes contact with the guide plate inside the aperture at a second position that is approximately opposite the first position.

12. The probe head assembly as recited in claim 9, wherein:
the tip portion of each of the one or more test probes includes a first portion disposed within the plurality of apertures in the guide plate and a second portion disposed between the apertures and the tip end, and
the second portion has a cross sectional area that is greater than a cross sectional area of the first portion, so that when the tip end makes contact with the device under test and the second portion makes contact with the guide plate, the tip end scrubs the device under test.

13. The probe head assembly recited in claim 9, wherein the template comprises a polymeric material.

14. The probe head assembly recited in claim 9, wherein the plurality of apertures disposed in the guide plate are coated with a non-conductive material.

15. A probe head assembly comprising:
a plurality of test probes, wherein one or more test probes from the plurality of test probes includes a tip portion with a tip end for making electrical contact with a device under test, a curved compliant body portion and a tail portion with a tail end for making electrical contact with a space transformer; and a probe head structure comprising:
a guide plate having a top surface and a bottom surface and a plurality of apertures formed therein and extending from the top surface to the bottom surface,
a template having a plurality of apertures formed therein,
wherein one or more of the guide plate or the template comprise silicon,
wherein the tip portions of the one or more test probes are disposed through the plurality of apertures in the guide plate, the tail portions of the one or more test probes are disposed through the plurality of apertures in the template and the curved compliant body portions of the one or more test probes are disposed between the guide plate and the template, and
wherein the tip portion of each of the one or more test probes includes a first portion disposed within the plurality of apertures in the guide plate and a second portion disposed between the apertures and the tip end, and the second portion has a cross sectional area that is greater than a cross sectional area of the first portion, so that when the tip end makes contact with the device under test, the second portion that has a cross sectional area that is greater than a cross sectional area of the first portion makes contact with the guide plate and causes the tip end to move laterally with respect to the guide plate and the device under test and scrub the device under test.

16. The probe head assembly as recited in claim 15, wherein a longitudinal axis of the tail portion of each of the one or more test probes is offset from a longitudinal axis of the tip portion of each of the one or more test probes.

17. The probe head assembly recited in claim 15, wherein:
the guide plate has a top surface and a bottom surface and the plurality of apertures in the guide plate extend from the top surface to the bottom surface of the guide plate, and
for each of the one or more test probes, the tail portion is offset from the tip portion to cause the tip portion to be biased in an aperture of the guide plate so that so that:
adjacent the top surface of the guide plate, the tip portion makes contact with the guide plate inside the aperture at a first position, and
adjacent the bottom surface of the guide plate, the tip portion makes contact with the guide plate inside the aperture at a second position that is approximately opposite the first position.

18. The probe head assembly recited in claim 15, wherein:
the guide plate has a top surface and a bottom surface and the plurality of apertures in the guide plate extend from the top surface to the bottom surface of the guide plate, and
the tip portions of the one or more test probes each include a hard stop feature disposed in contact with the top surface of the guide plate and limits longitudinal movement of the test probes within the plurality of apertures in the guide plate.

19. The probe head assembly recited in claim 15, wherein the template comprises a polymeric material.

20. The probe head assembly recited in claim 15, wherein the plurality of apertures disposed in the guide plate are coated with a non-conductive material.

21. A probe head assembly comprising:
a plurality of test probes, wherein one or more test probes from the plurality of test probes include a tip portion with a tip end for making electrical contact with a device under test, a curved compliant body portion and a tail portion with a tail end for making electrical contact with a space transformer; and
a probe head structure comprising:
a guide plate having a plurality of apertures formed therein,
a template having a plurality of apertures formed therein,
wherein one or more of the guide plate or the template comprise silicon,
wherein the tip portions of the one or more test probes are disposed through the plurality of apertures in the guide plate, the tail portions of the one or more test probes are disposed through the plurality of apertures in the template and the curved compliant body portions of the one or more test probes are disposed between the guide plate and the template,
wherein the tip portions of the one or more test probes each include a hard stop feature that is disposed in contact with the top surface of the guide plate and limits longitudinal movement of the test probes within the plurality of apertures in the guide plate,
wherein the curved compliant body portions of the one or more test probes are shaped so that for each of the one or more test probes, the tail portion is offset from the tip portion, and
wherein the tip portion of each of the one or more test probes includes a first portion disposed within the plurality of apertures in the guide plate and a second portion disposed between the apertures and the tip end, and the second portion has a cross sectional area that is greater than a cross sectional area of the first portion, so that when the tip end makes contact with the device under test, the second portion that has a cross sectional area that is greater than a cross sectional area of the first portion makes contact with the guide plate and causes the tip end to move laterally with respect to the guide plate and the device under test and scrub the device under test.

* * * * *